United States Patent
Yamamoto et al.

(10) Patent No.: US 8,649,096 B2
(45) Date of Patent: Feb. 11, 2014

(54) FINE GRATING AND MOLD THEREFOR

(75) Inventors: Kazuya Yamamoto, Osaka (JP); Makoto Okada, Osaka (JP)

(73) Assignee: Nalux Co., Ltd., Osaka (JP)

( * ) Notice: Subject to any disclaimer, the term of this patent is extended or adjusted under 35 U.S.C. 154(b) by 892 days.

(21) Appl. No.: 11/921,324

(22) PCT Filed: May 22, 2006

(86) PCT No.: PCT/JP2006/310167
§ 371 (c)(1),
(2), (4) Date: Feb. 8, 2008

(87) PCT Pub. No.: WO2006/129514
PCT Pub. Date: Dec. 7, 2006

(65) Prior Publication Data
US 2009/0034079 A1    Feb. 5, 2009

(30) Foreign Application Priority Data
Jun. 3, 2005  (JP) .................... 2005-164315

(51) Int. Cl.
G02B 5/18    (2006.01)
B29D 11/00    (2006.01)

(52) U.S. Cl.
USPC .......................... 359/569; 264/1.1

(58) Field of Classification Search
USPC ............... 359/566, 569, 571; 216/24; 264/1.1
See application file for complete search history.

(56) References Cited

U.S. PATENT DOCUMENTS

| | | | | |
|---|---|---|---|---|
| 4,013,465 A | * | 3/1977 | Clapham et al. | 430/11 |
| 7,145,721 B2 | * | 12/2006 | Banish et al. | 359/569 |
| 7,618,564 B2 | * | 11/2009 | Schilling et al. | 264/1.31 |
| 2004/0247010 A1 | | 12/2004 | Okada et al. | |
| 2005/0025423 A1 | | 2/2005 | Hanaoka et al. | |
| 2005/0074579 A1 | * | 4/2005 | Suzuki et al. | 428/141 |
| 2005/0094277 A1 | * | 5/2005 | Khusnatdinov et al. | 359/601 |

FOREIGN PATENT DOCUMENTS

| | | | |
|---|---|---|---|
| EP | 1424573 | * | 6/2004 |
| JP | 2001-272505 | | 10/2001 |
| JP | 2004-085831 | | 3/2004 |
| JP | 2004-287238 | | 10/2004 |
| JP | 2005-037868 | | 2/2005 |
| WO | 2004/031815 A1 | | 4/2004 |

OTHER PUBLICATIONS

Grann et al., "Optimal design for antireflective tapered two-dimensional subwavelength grating structures", vol. 12, No. 2, Optical Society of America, Feb. 1995, pp. 333-339.

* cited by examiner

*Primary Examiner* — Alessandro Amari
(74) *Attorney, Agent, or Firm* — Squire Sanders (US) LLP (57) ABSTRACT

This invention provides a mold with which a two-dimensional subwavelength grating can be produced with a higher percentage transfer by injection molding and a two-dimensional subwavelength grating having a high aspect ratio produced with such a mold. The mold for a fine grating according to the present invention has protrusion parts (107) arranged at an interval on the bottom face (103) of a cavity, wherein the interval is a distance between centers of the protrusion parts and a period of the fine grating smaller than wavelengths of visible lights. In one embodiment, a cross-section of the protrusion parts, parallel to the bottom face of the cavity decreases with height along the protrusion parts and a decreasing rate of the cross-section increases with height along the protrusions.

8 Claims, 9 Drawing Sheets

SECTION ALONG A-A'

SECTION ALONG B-B'

SECTION ALONG C-C'

PRIOR ART

PRIOR ART

FINE GRATING AND MOLD THEREFOR

TECHNICAL FIELD

The present invention relates to a fine grating and a mold therefore. More particularly, the present invention relates to a mold which achieves a high percentage transfer for a two-dimensional fine grating having a period smaller than wavelengths of visible lights and the fine grating formed with that mold.

BACKGROUND ART

As a fine grating for reflection prevention, a grating in which conical or pyramidal protrusions are arranged cyclically two-dimensionally has been known (for example, GRANN, E. B. et al "Optimal design for antireflective tapered two-dimensional subwavelength grating structures", Optical Society of America, February 1995, Vol. 12, No. 2, pages 333-339). On the base plate of the grating, a period in the X direction and a period in the Y direction are equal to each other and this period is set smaller than wavelengths of visible lights. In this specification, such a grating is called two-dimensional grating or two-dimensional subwavelength grating. It has been known that a two-dimensional subwavelength grating having conical grating protrusion parts (projecting portions) has antireflective effect on a wide wavelength band like an element in which plural thin film layers changing continuously are stacked.

As a method for manufacturing such a two-dimensional subwavelength grating, there has been known a method in which a resist undergoes exposing by turning ON/OFF electron beam with an electron beam exposing unit based on a cyclic dot-like pattern data so as to form a resist pattern and a substrate undergoes etching using this resist pattern as a mask so as to form a two-dimensional subwavelength grating having a desired structure on the substrate (for example, Japanese Patent Application Laid-Open No. 2004-85831). Further, there has been known also a method in which after a dot array-like metal mask is formed on an optical device, reactive ion etching is performed in such a way that the metal mask decreases gradually and it finally vanishes so as to form a conical portions (for example, Japanese Patent Application Laid-Open No. 2001-272505).

However, the methods mentioned above are complicated in their processes and cost much.

On the other hand, there has been known a method in which a two-dimensional subwavelength grating is formed with a mold in order to provide antireflective material having a low reflectance at a low cost (for example, Japanese Patent Application Laid-Open No. 2004-287238).

However, even in the above-described method it is difficult to improve a percentage transfer when a two-dimensional subwavelength grating is produced by injection molding using a mold and therefore, it is difficult to obtain a two-dimensional subwavelength grating having a high aspect ratio. A percentage transfer mentioned here refers to a ratio of a depth of a concave part in a molded product to a height of the corresponding protrusion part of the mold or a ratio of a height of a protrusion part of the molded product to a depth of the corresponding concave part in the mold. Further, an aspect ratio refers to a ratio of a height of the protrusion part of the grating to a arrangement period of the grating.

The reason why it is difficult to improve a percentage transfer when manufacturing a two-dimensional subwavelength grating by injection molding using a mold will be described below.

Figure 7:
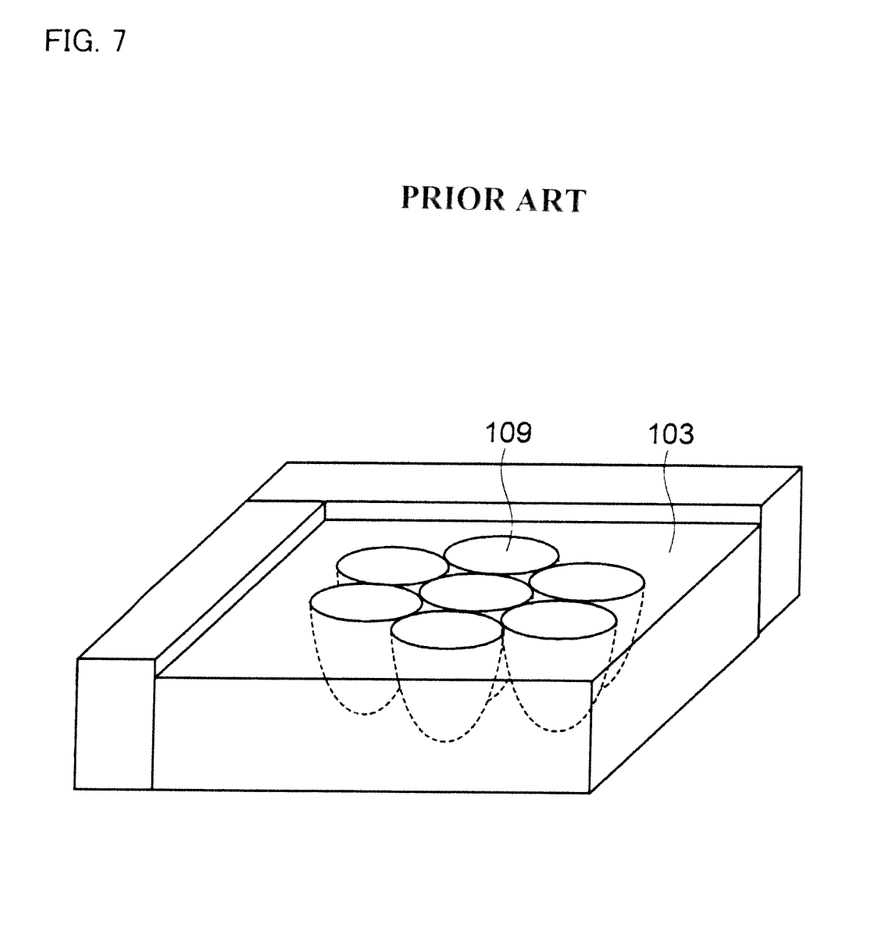
FIG. 7 is a drawing showing a shape of a conventional mold for use in manufacturing a two-dimensional subwavelength grating by injection molding.

FIG. 7 is a drawing showing a shape of a conventional mold for use in manufacturing a two-dimensional subwavelength grating by injection molding. In FIG. 7, a cavity bottom face of the mold is indicated with reference numeral 103. Reference numeral 109 indicates a concave part in the mold for forming a protrusion part of the two-dimensional subwavelength grating.

Figure 8:
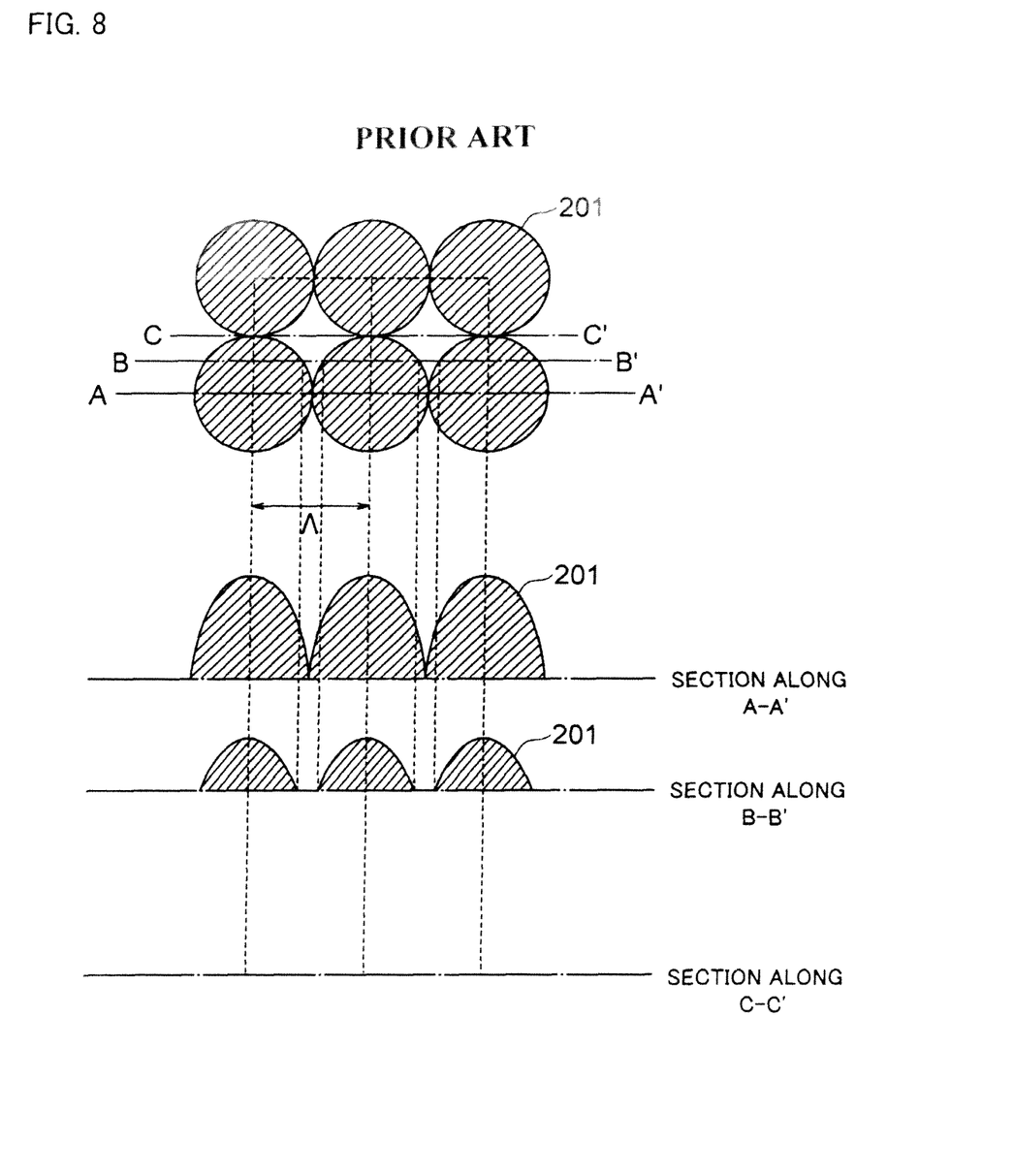
FIG. 8 is a drawing showing a shape of protrusion parts of the grating formed with the mold shown in FIG. 7.

FIG. 8 is a drawing showing a shape of protrusion parts of the grating formed with the mold shown in FIG. 7. In FIG. 8, protrusion parts of the grating are indicated with reference numeral 201. The four drawings in FIG. 8 show a plan view, a sectional view taken along A-A', a sectional view taken along B-B' and a sectional view taken along C-C', from top to bottom.

In the plan view the diagonally shaded circular areas indicate protrusion parts of the grating. Areas besides the diagonally shaded areas indicate a plane corresponding to the cavity bottom face of the mold.

In the sectional view taken along A-A', the sectional view taken along B-B' and sectional view taken along C-C', the diagonally shaded areas indicate cross-sections of protrusion parts of the grating. Assuming that the directions of A-A', B-B' and C-C' are X direction, the protrusion parts 201 of the grating are arranged at a certain period Λ in the X direction and the Y direction. Although sectional shapes are of parabola in the drawing, the sectional shapes may be triangular or of other shape.

Figure 9:
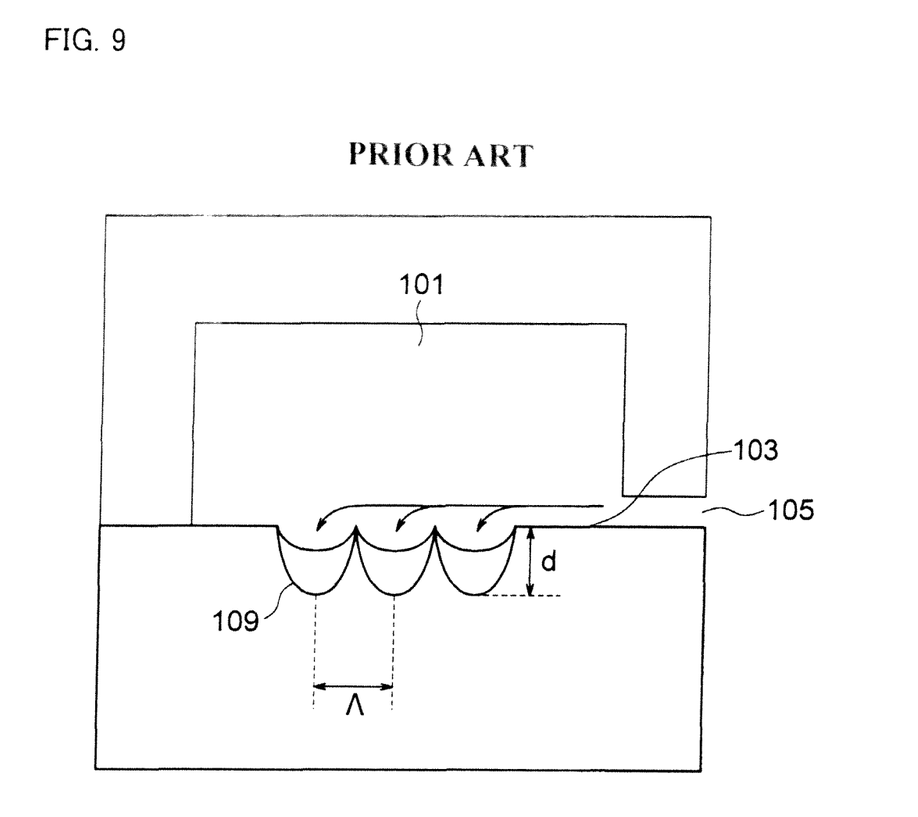
FIG. 9 is a diagram showing a section of the mold shown in FIG. 7.

FIG. 9 is a drawing showing a cross-section of the mold shown in FIG. 7. In FIG. 9, a cavity of the mold is indicated with reference numeral 101 and a pouring port for synthetic resin is indicated with reference numeral 105. Like in FIG. 7, the cavity bottom face of the mold is indicated with reference numeral 103 and concave parts of the mold are indicated with reference numeral 109. A period at which the concave parts 109 of the mold are arranged is Λ and a depth of the concave parts of the mold is d. Here, period Λ is for example, 350 nm and depth d is 350 nm.

In FIG. 9, synthetic resin poured into the cavity 101 of the mold from the pouring port 105 flows along the cavity bottom face 103 as indicated with arrows, attempting to flow into the concave parts 109 of the mold. A diameter of the concave parts 109 of the mold on the cavity bottom face 103 is 350 nm which is equal to the period Λ.

Generally, assuming that a size of an object in fluid is L, Reynolds number which is a ratio of inertial force to viscous force is proportional to square of L. Thus, as the size decreases, the viscous force becomes dominant. Because the diameter of the concave parts 109 of the mold on the cavity bottom face 103 is 350 nm, which is very small, the viscous force is large with respect to a pressure, so that synthetic resin cannot easily flow into the concave parts 109 of the mold. As the cavity 101 of the mold is filled with synthetic resin so that the pressure of the synthetic resin increases, the synthetic resin gradually flows into the concave parts 109 of the mold.

The concave parts 109 of the conventional mold do not communicate with each other. Thus, air in the concave parts 109 of the conventional mold collects at the bottom portions of the concave parts 109 of the mold because it has no escape route. Consequently, synthetic resin more than a predetermined ratio cannot flow into the concave parts 109 of the mold due to pressure of the air. When a depth d of the concave parts 109 of the mold is 350 nm, a height of protrusion parts 201 of the grating formed with the concave parts 109 of the mold is as small as 180 nm. That is, the percentage transfer is only about 51%.

Thus, when a two-dimensional subwavelength grating is manufactured by injection molding using a mold, it is difficult to improve the percentage transfer due to viscous force and air collecting in the concave parts of the mold.

When a height of protrusion parts of the grating is 180 nm in the two-dimensional subwavelength grating manufactured with the conventional mold, reflectances of lights having a wavelength of 400 nm, 600 nm and 800 nm are 0.41%, 0.55% and 1.21% respectively.

DISCLOSURE OF THE INVENTION

Under the above-described circumstances, a mold with which a two-dimensional subwavelength grating can be produced with a higher percentage transfer by injection molding and a two-dimensional subwavelength grating having a high aspect ratio produced with such a mold have been highly demanded.

A mold for a fine grating of the present invention has protrusion parts arranged at an interval on the bottom face of a cavity, wherein the interval is a distance between centers of the protrusion parts and a period of the fine grating smaller than wavelengths of visible lights.

According to the present invention, because spaces between the protrusion parts (projecting portions) of the mold communicate with each other, air between the protrusion parts of the mold can escape when synthetic resin flows in. Therefore, unlike a case where concave parts are provided in the bottom face of the cavity, flow-in of synthetic resin will not be prevented due to increasing air pressure. As a result, fine gratings having a high percentage transfer can be obtained.

According to an embodiment of the present invention, a cross-section of the protrusion parts, parallel to the bottom face of the cavity decreases with height along the protrusion parts and a decreasing rate of the cross-section increases with height along the protrusions.

When the protrusion parts of the mold are formed in such a way as mentioned above, even if a percentage transfer is reduced so that a portion near the vertex of the grating protrusion parts is not formed, an influence upon reflectance property is limited because a changing rate of a cross-sectional area of the portion near the vertex is small.

According to other embodiment of the present invention, cross-sections of the protrusion parts, parallel to the bottom face of the cavity are circular.

According to another embodiment of the present invention, the protrusion parts are arranged on the bottom face of the cavity such that centers of circles of the cross-sections of the protrusion parts on the bottom face of the cavity are located at positions of vertexes of squares having sides a length of which is equal to a length of the diameter of the circles.

According to other embodiment of the present invention, the protrusion parts are arranged on the bottom face of the cavity such that centers of circles of the cross-sections of the protrusion parts on the bottom face of the cavity are located at positions of vertexes of regular triangles having sides a length of which is equal to a length of the diameter of the circles.

By arranging the protrusion parts on the bottom face of the cavity of the mold in such a way as mentioned above, a two-dimensional fine grating with a certain period can be realized.

According to another embodiment of the present invention, the protrusion parts of the mold are paraboloidal When the protrusion parts of the mold are formed in such a way as mentioned above, even if a percentage transfer is reduced so that a portion near the vertex of the grating protrusion parts is not formed, an influence upon reflectance property is limited because a changing rate of a cross-sectional area of the portion near the vertex is small.

A fine grating according to the present invention is formed with a mold according to one of the embodiments of the present invention.

Accordingly, a percentage transfer is high and reflectance property is excellent.

According to an embodiment of the present invention, the fine grating is formed of synthetic resin.

BEST MODE FOR CARRYING OUT THE INVENTION

Figure 1:
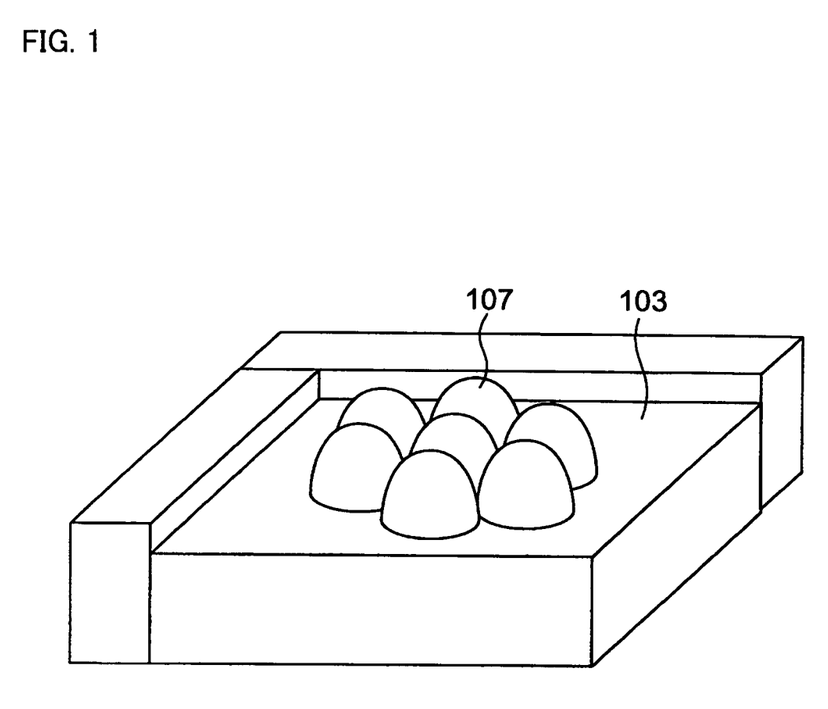
FIG. 1 is a drawing showing a shape of the mold according to an embodiment of the present invention for use in manufacturing a two-dimensional subwavelength grating by injection molding.

FIG. 1 is a drawing showing a shape of the mold according to an embodiment of the present invention for use in manufacturing a two-dimensional subwavelength grating by injection molding. In FIG. 1, the cavity bottom face of the mold is indicated with reference numeral 103. The protrusion parts of the mold for forming the grating of the two-dimensional subwavelength grating is indicated with reference numeral 107. In this embodiment, it should be noticed that the mold has protrusion parts 107 on the cavity bottom face 103, instead of concave parts.

Figure 2:
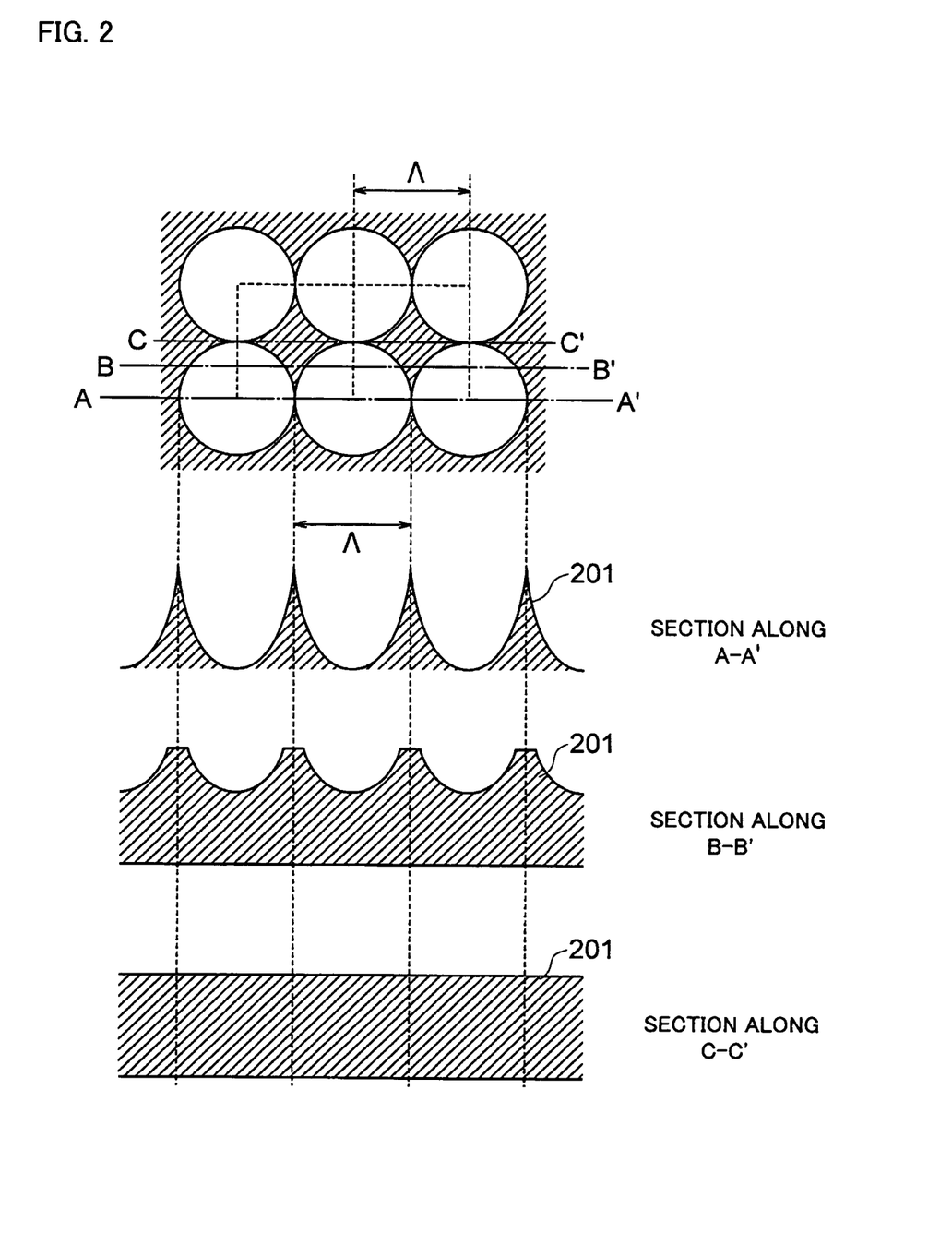
FIG. 2 is a drawing showing a shape of protrusion parts of the grating formed with the mold shown in FIG. 1.

FIG. 2 is a drawing showing a shape of protrusion parts of the grating formed with the mold shown in FIG. 1. In FIG. 2, protrusion parts of the grating (projecting portions) are indicated with reference numeral 201. The four drawings in FIG. 2 show a plan view, a sectional view taken along A-A', a sectional view taken along B-B' and a sectional view taken along C-C', from top to bottom.

In the plan view, the diagonally shaded areas indicate the highest plane of the protrusion parts of the grating. This plane corresponds to the cavity bottom face of the mold. The circles in the plan view correspond to the bottom faces of the protrusion parts 107 of the mold. Adjoining circles are arranged such that they make contact with each other and the centers of the adjoining circles form squares. Bottom faces of protrusions of the mold may be of regular polygon such as regular triangle, square, regular hexagon.

In the sectional view taken along A-A', the sectional view taken along B-B' and the sectional view taken along C-C', the diagonally shaded areas indicate cross-sections of the protrusion parts of the grating. Assuming that the directions of A-A', B-B' and C-C' are X direction, the protrusion parts of the grating are arranged at a certain period Λ in the X direction and Y direction. Here, cross-sectional shapes of protrusion parts of the grating are of parabola. The reason why the cross-sectional shapes of protrusion parts of the grating are of parabola is to reduce a decreasing rate of a cross-sectional area parallel to the bottom face of a protrusion part of the grating with height along the protrusion part of the grating. Consequently, even if a percentage transfer is decreased so that a portion near the vertex of the protrusion part of the grating is not formed, an influence upon reflectance property is advantageously small. If this advantage is neglected, the cross-sectional shape may be triangular or of other shape.

Figure 3:
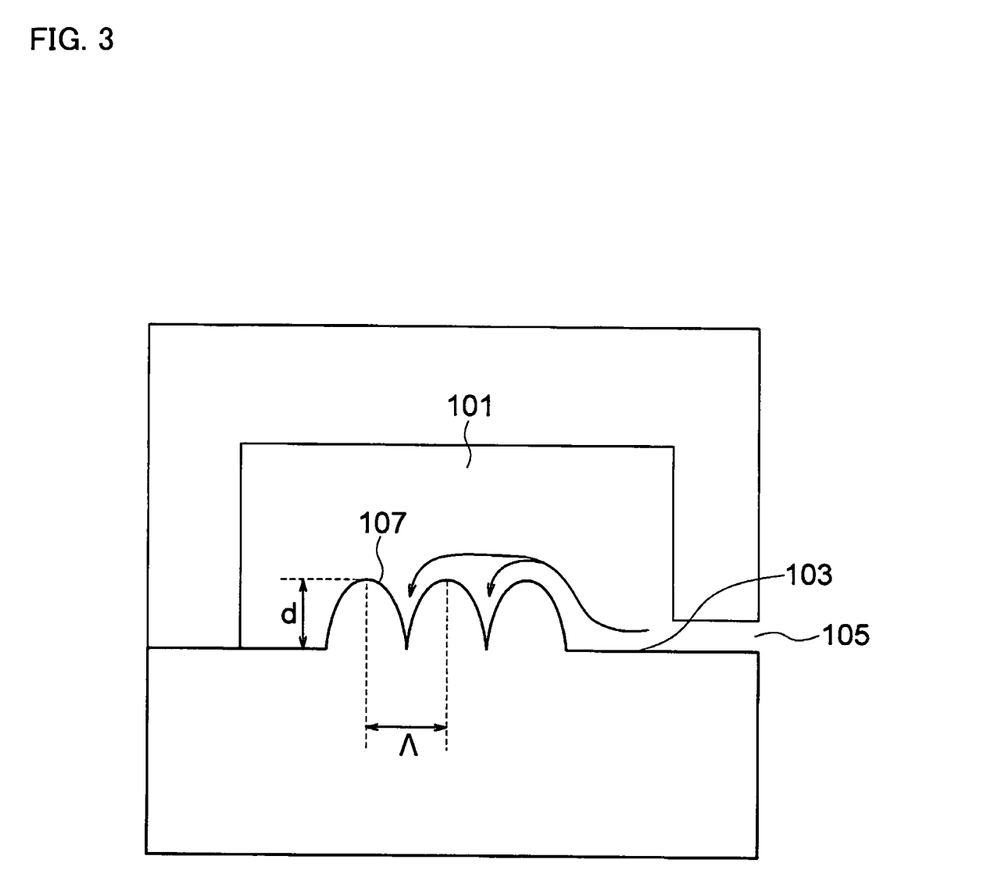
FIG. 3 is a drawing showing cross-sections of the mold shown in FIG. 1.

FIG. 3 is a drawing showing a cross-section of the mold shown in FIG. 1. In FIG. 3, the cavity of the mold is indicated with reference numeral 101 and the pouring port for synthetic resin is indicated with reference numeral 105. Like in FIG. 1, the cavity bottom face of the mold is indicated with reference numeral 103 and the protrusion parts of the mold is indicated with reference numeral 107. A period at which the protrusion parts 107 of the mold are arranged is Λ and a height of the protrusion parts of the mold is d. Here, period Λ is, for example, 350 nm and height d is 350 nm.

In FIG. 3, synthetic resin poured into the cavity 101 of the mold from the pouring port 105 flows along the protrusion parts 107 of the mold as indicated with arrows, attempting to flow into between the protrusion parts of the mold. A diameter of the protrusion parts 107 of the mold on the cavity bottom face 103 is 350 nm which is equal to period Λ.

More specifically, the synthetic resin is acrylic, cycloolefin, polycarbonate or the like. The temperature range for pouring is 250° C. to 280° C.

Generally, assuming that a size of an object in fluid is L, Reynolds number which is a ratio of inertial force to viscous force is proportional to square of L. Thus, as the size decreases, the viscous force becomes dominant. Because the diameter of the concave parts 107 of the mold on the cavity bottom face 103 is 350 nm, which is very small, the viscous force is large with respect to the pressure, so that synthetic resin cannot easily flow into between the protrusion parts of the mold. As the cavity 101 of the mold is filled with synthetic resin so that the pressure of the synthetic resin increases, the synthetic resin gradually flows into between the protrusion parts of the mold.

The concave parts 109 of the conventional mold do not communicate with each other. Thus, when synthetic resin flows into the concave parts 109 of the mold, air in the concave parts of the conventional mold collects at the bottom portion of the concave parts 109 of the mold because it has no escape route. Consequently, synthetic resin more than a predetermined ratio cannot flow into the concave parts 109 of the mold due to pressure of the air. However, in this embodiment, air between the protrusion parts of the mold can escape when synthetic resin flows in, because spaces between the protrusion parts of the mold communicate with each other. Thus, the flow-in of the synthetic resin is not prevented due to increasing pressure of the air.

When height d of the protrusion parts 107 of the mold is 350 nm, height of protrusion parts of the grating formed with the protrusion parts 107 of the mold is 300 to 350 nm. That is, the percentage transfer is about 85% to 100%.

According to this embodiment, the percentage transfer can be improved remarkably when the two-dimensional subwavelength grating is manufactured by injection molding using the mold.

When a height of protrusion parts of the grating is 350 nm in the two-dimensional subwavelength grating manufactured with the mold of this embodiment, reflectances of lights having a wavelength of 400 nm, 600 nm and 800 nm are 0.14%, 0.21% and 0.37%, respectively.

Figure 4:
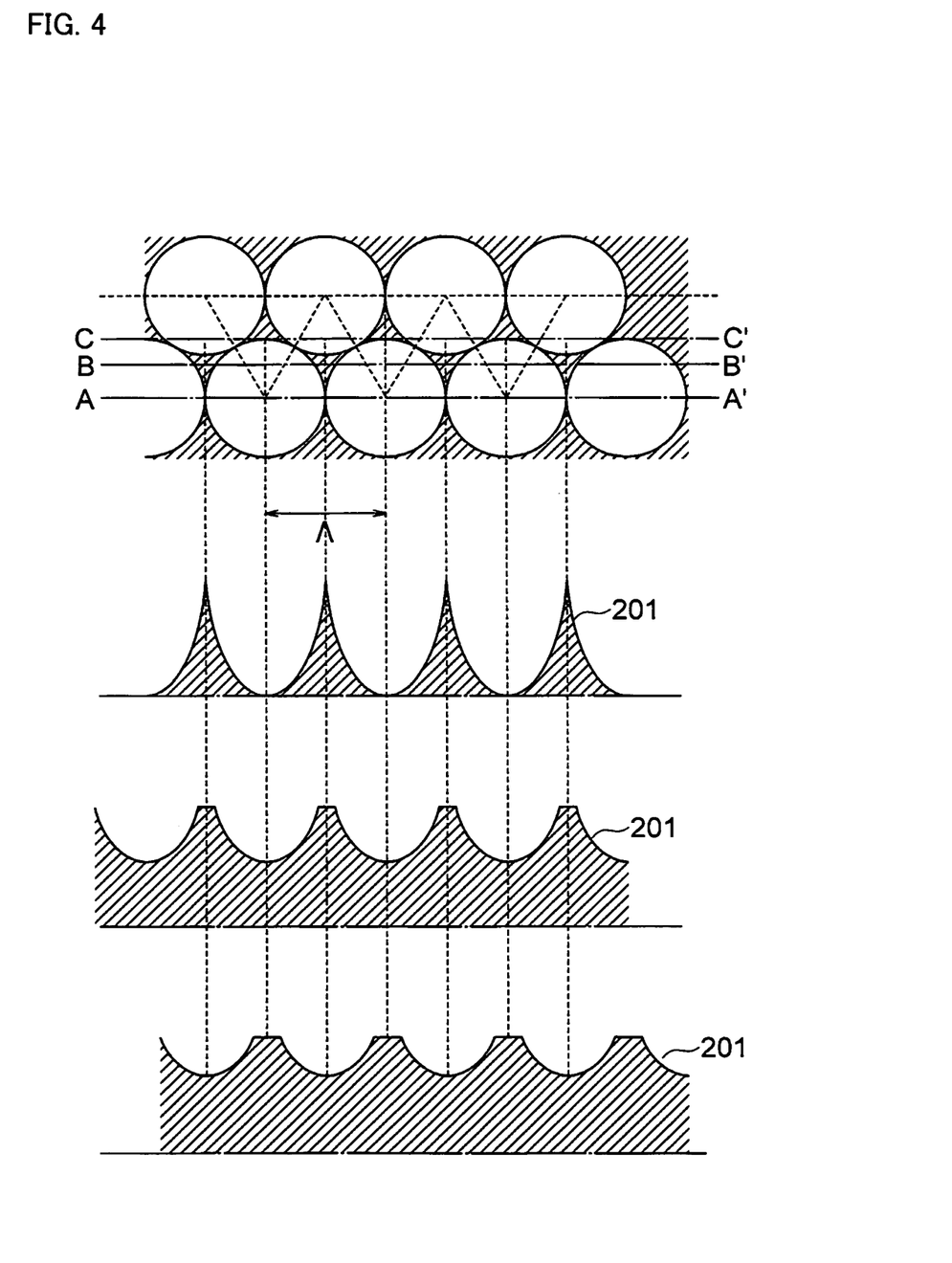
FIG. 4 is a drawing showing a shape of protrusion parts of the grating according to another embodiment of the present invention.

FIG. 4 is a drawing showing a shape of protrusion parts of the grating according to another embodiment of the present invention. In FIG. 4, protrusion parts of the grating are indicated with reference numeral 201. The four drawings of FIG. 4 show a plan view, a sectional view taken along A-A', a sectional view taken along B-B' and a sectional view taken along C-C', from top to bottom.

In the plan view, the diagonally shaded areas indicate the highest plane of the protrusion parts of the grating. This plane corresponds to the cavity bottom face of the mold. Circles in the plan view correspond to the bottom faces of the protrusion parts 107 of the mold. Adjoining circles are arranged such that they make contact with each other and the centers of the adjoining circles form regular triangles. In this embodiment, the area of the highest plane of the protrusion part of the grating is smaller than that of the embodiment shown in FIG. 2. Thus, a reflectance is smaller than that of the embodiment shown in FIG. 2, which is more preferable.

In the sectional view taken along A-A', the sectional view taken along B-B' and the sectional view taken along C-C', the diagonally shaded areas indicate cross-sections of the protrusion parts of the grating. Assuming that the directions of A-A', B-B' and C-C' are X direction, protrusion parts 201 of the grating are arranged at a certain period Λ in the X direction and Y direction. Here, cross-sectional shapes of protrusion parts of the grating are of parabola. The reason why the cross-sectional shapes of protrusion parts of the grating are of parabola is to reduce a decreasing rate of a cross-sectional area parallel to the bottom face of a protrusion part of the grating with height along the protrusion part of the grating. Consequently, even if the percentage transfer is decreased so that a portion near the vertex of the grating protrusion part is not formed, an influence upon reflectance property is advantageously small. If this advantage is neglected, the cross-sectional shape may be triangular or of other shapes.

In this embodiment also, air between the protrusion parts of the mold can escape because spaces between the protrusion parts of the mold communicate with each other. Thus, the flow-in of the synthetic resin is not prevented due to increasing pressure of the air.

When height d of the protrusion parts 107 of the mold is 350 nm, height of protrusion parts of the grating formed with the protrusion parts 107 of the mold is 300 to 350 nm. That is, the percentage transfer is about 85% to 100%.

According to this embodiment, the percentage transfer can be improved remarkably when a two-dimensional subwavelength grating is manufactured by injection molding using the mold.

When a height of protrusion parts of the grating is 350 nm in the two-dimensional subwavelength grating manufactured with the mold of this embodiment, reflectances of lights having a wavelength of 400 nm, 600 nm and 800 nm are 0.13%, 0.19% and 0.14%, respectively.

Figure 5:
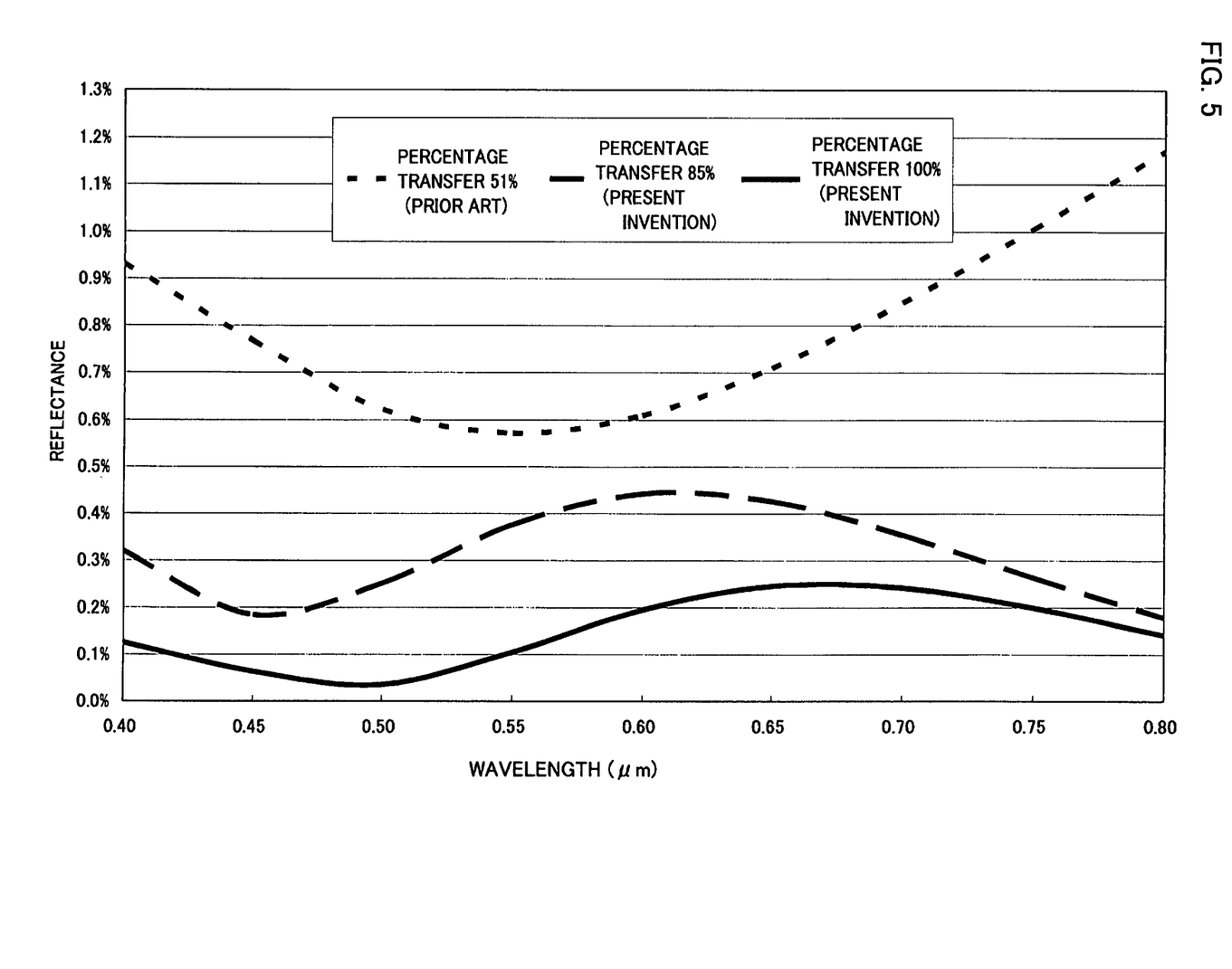
FIG. 5 is a drawing showing changes in reflectance to the wavelength in case where the percentage transfer is 85%, 100% in this embodiment and in case where the percentage transfer is 51% in the conventional art.

FIG. 5 is a drawing showing changes in reflectance to wavelength in case where the percentage transfer is 85%, 100% in this embodiment and in case where the percentage transfer is 51% in the conventional art.

Figure 6:
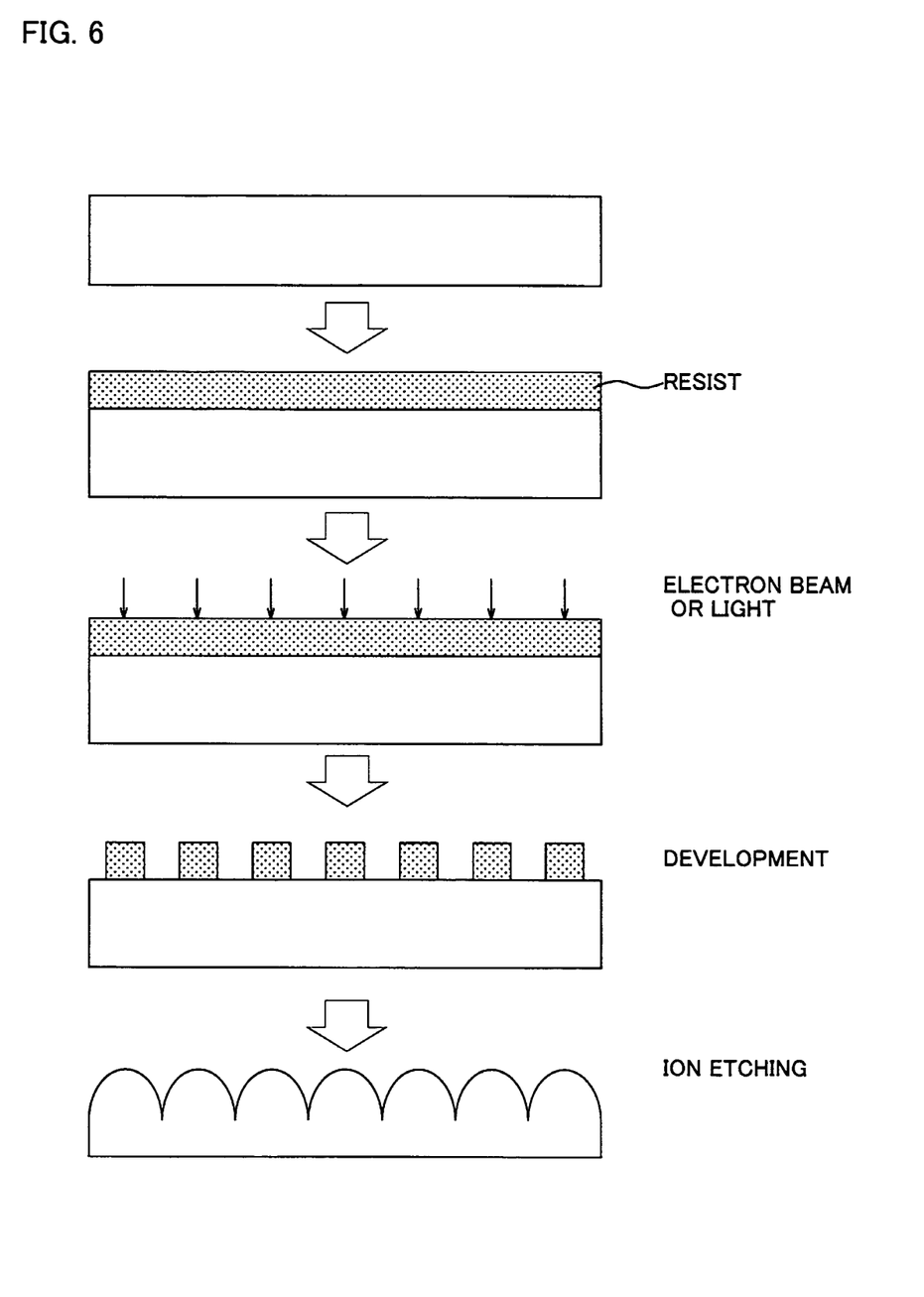
FIG. 6 is a drawing showing a manufacturing method of a mold having protrusion parts arranged at a certain period Λ.

A manufacturing method of a mold having protrusion parts arranged at a certain period Λ will be described with reference to FIG. 6.

First, resist is deposited on a substrate and then, electron beam or light is irradiated thereon in such a way that a circular pattern is obtained and the centers of the circles may be vertexes of the grating. After that, resist is removed by developing process. By ion-etching the patterned shape until the resist is eliminated, a mold of a fine grating with protrusion parts having a shape of paraboloid of revolution, can be manufactured.

A fine grating and a mold therefore, according to the present invention have been described by referring to antireflective two-dimensional subwavelength gratings as examples. The fine grating of the present invention can also be used for a resonance mode filter and other applications.

The invention claimed is:

1. A fine grating having a period smaller than wavelengths of visible lights, wherein a top face thereof, which is at an outermost position of the fine grating, has a plurality of flat portions and a plurality of concave parts and the plurality of the flat portions are directly in contact with each other on the top face and not through the concave parts and the plurality of concave parts are in direct contact with each other on the top face wherein shapes of a cross-section perpendicular to the top face of the plurality of concave parts are of parabola.

2. The fine grating according to claim 1, wherein a size of a cross-section of each of the concave parts, parallel to the flat portions decreases with depth along each of the concave parts and a decreasing rate of the cross-section increases with depth along each of the concave parts.

3. The fine grating according to claim 1, wherein a cross-section of each of the concave parts is circular.

4. The fine grating according to claim 3, wherein the concave parts are arranged on the top face such that a center of a circle of a cross-section is located at positions of vertexes of squares having sides a length of which is equal to a length of a diameter of the circle.

5. The fine grating according to claim 3, wherein the concave parts are arranged on the top face such that a center of a circle of a cross-section is located at positions of vertexes of regular triangles having sides a length of which is equal to a length of a diameter of the circle.

6. The fine grating according to claim 3, wherein each of the plurality of the concave parts is paraboloidal.

7. A mold for a fine grating having a plurality of protrusion parts arranged on a bottom face of a cavity, which is at an innermost position of the mold such that an interval between centers of bases of the protrusion parts is equal to a period of a fine grating smaller than wavelengths of visible lights and portions of the bottom face of the cavity except the protrusion parts are flat portions being in contact with each other on the bottom face and not through the protrusion parts and the protrusion parts are in direct contact with each other on the bottom face wherein shapes of a cross-section perpendicular to the bottom face of the plurality of protrusion parts are of parabola.

8. The mold for a fine grating according to claim 7, wherein a size of a cross-section of each of the protrusion parts, parallel to the bottom face of the cavity decreases with height along each of the protrusion parts and a decreasing rate of the cross-section increases with height along each of the protrusion parts.

* * * * *